United States Patent
Edwards et al.

(10) Patent No.: US 6,388,595 B1
(45) Date of Patent: May 14, 2002

(54) DITHERING APPARATUS TO PROPERLY REPRESENT ALIASED SIGNALS FOR HIGH SPEED SIGNAL SAMPLING

(75) Inventors: Forrest A. Edwards, Wilsonville; Eric P. Etheridge, Beaverton, both of OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/777,358

(22) Filed: Feb. 5, 2001

Related U.S. Application Data
(60) Provisional application No. 60/180,017, filed on Feb. 3, 2000.

(51) Int. Cl.$^7$ .......................... H03M 1/20; H03M 1/62; H03M 1/84; H03M 1/88
(52) U.S. Cl. ....................... 341/131; 341/139
(58) Field of Search .................... 341/110, 155, 341/139, 131, 122; 348/607; 708/276

(56) References Cited

U.S. PATENT DOCUMENTS

| | | | |
|---|---|---|---|
| 3,562,420 A | * 2/1971 | Thompson | ................. 348/607 |
| 4,142,146 A | 2/1979 | Schumann | |
| 4,700,173 A | * 10/1987 | Araki et al. | ................. 341/122 |
| 4,901,265 A | * 2/1990 | Kerr et al. | ................. 708/276 |
| 5,115,189 A | 5/1992 | Holcomb | |
| 5,530,442 A | * 6/1996 | Norsworthy et al. | ........ 341/131 |
| 5,789,954 A | 8/1998 | Toeppen | |

* cited by examiner

*Primary Examiner*—Patrick Wamsley
(74) *Attorney, Agent, or Firm*—Thomas F. Lenihan

(57) ABSTRACT

The subject invention addresses the problem of aliasing in subsampled data by adding dither to the timing of the subsampling of the data. The subject invention solves a speed problem caused by delays in modifying (i.e., dithering) the A/D converter sampling clock. It is herein recognized that to maintain a high acquisition rate one should randomly select (i.e., dither) samples after demultiplexing the data into a wider and slower stream of samples, rather than attempting to modify the high speed A/D converter sampling clock.

16 Claims, 1 Drawing Sheet

DITHERING APPARATUS TO PROPERLY REPRESENT ALIASED SIGNALS FOR HIGH SPEED SIGNAL SAMPLING

This application claims benefit of provisional application Ser. No. 60/180,017, filed Feb. 3, 2000.

BACKGROUND OF THE INVENTION

In digital oscilloscopes, analog signals are sampled at discrete time intervals. An Analog-to-Digital Converter (A/D) converts the sampled signal to a digital representation. The digital representation is usually stored in memory. In many cases it is desirable to store the data at less frequent time intervals than it is sampled by the A/D converter. This is known as subsampling the data. Subsampling can lead to aliasing in the stored data. That is, if the analog signal contains frequencies higher than ½ the subsampling frequency, these higher frequencies will show up in the stored data as a lower frequency signal. This problem is known as aliasing. Aliasing can lead to the display of faulty data on oscilloscopes. For example, a 99 MHz sine wave subsampled at a ten nanosecond (10 ns) interval will appear on screen as a 1 MHz sine wave.

There have been many attempts to solve the aliasing problem. Prior art U.S. patent U.S. Pat. No. 5,115,189 (Holcomb) entitled, ANTI-ALIASING DITHERING METHOD AND APPARATUS FOR LOW FREQUENCY SIGNAL SAMPLING, addressed the problem in a manner that is feasible only for low sampling rates. In Holcomb, data was processed one sample at a time as it was sampled by the A/D converter. Cost effective circuitry can not process data in this manner at high sampling rates. At lower sampling rates the dither is effective only for lower input signal frequencies. Also at lower sampling frequencies the aliased signals are not converted to noise as effectively. The bandwidth of the noise is lower causing aliasing artifacts to be more prevalent.

U.S. Pat. No. 5,789,954 (Toeppen, et al.) entitled PHASE DITHER OF AN ACQUISITION CLOCK USING A DELAY LOCK LOOP, modulates the phase of an acquisition clock by summing an offset voltage with the output of the phase detector of a delay loop. The offset voltage is generated by a digital to analog (D/A) converter which receives input values from a microprocessor which is running a pseudo-random number generator routine. The solution of Toeppen is suitable for relatively low speed operation only due to the long settling time required for the loop to lock between acquisitions.

What is needed is an apparatus that solves the aliasing problem at the high speeds required of today's oscilloscopes.

SUMMARY OF THE INVENTION

The subject invention addresses the problem of aliasing in subsampled data by adding dither to the timing of the subsampling of the data. The subject invention solves the speed problem referred-to above by dithering data that has been demultiplexed into a wider and slower stream of samples. It is herein recognized that to maintain a high acquisition rate one should randomly select samples after demultiplexing rather than attempting to modify the A/D converter sampling clock.

DETAILED DESCRIPTION OF THE DRAWING

Figure 1:
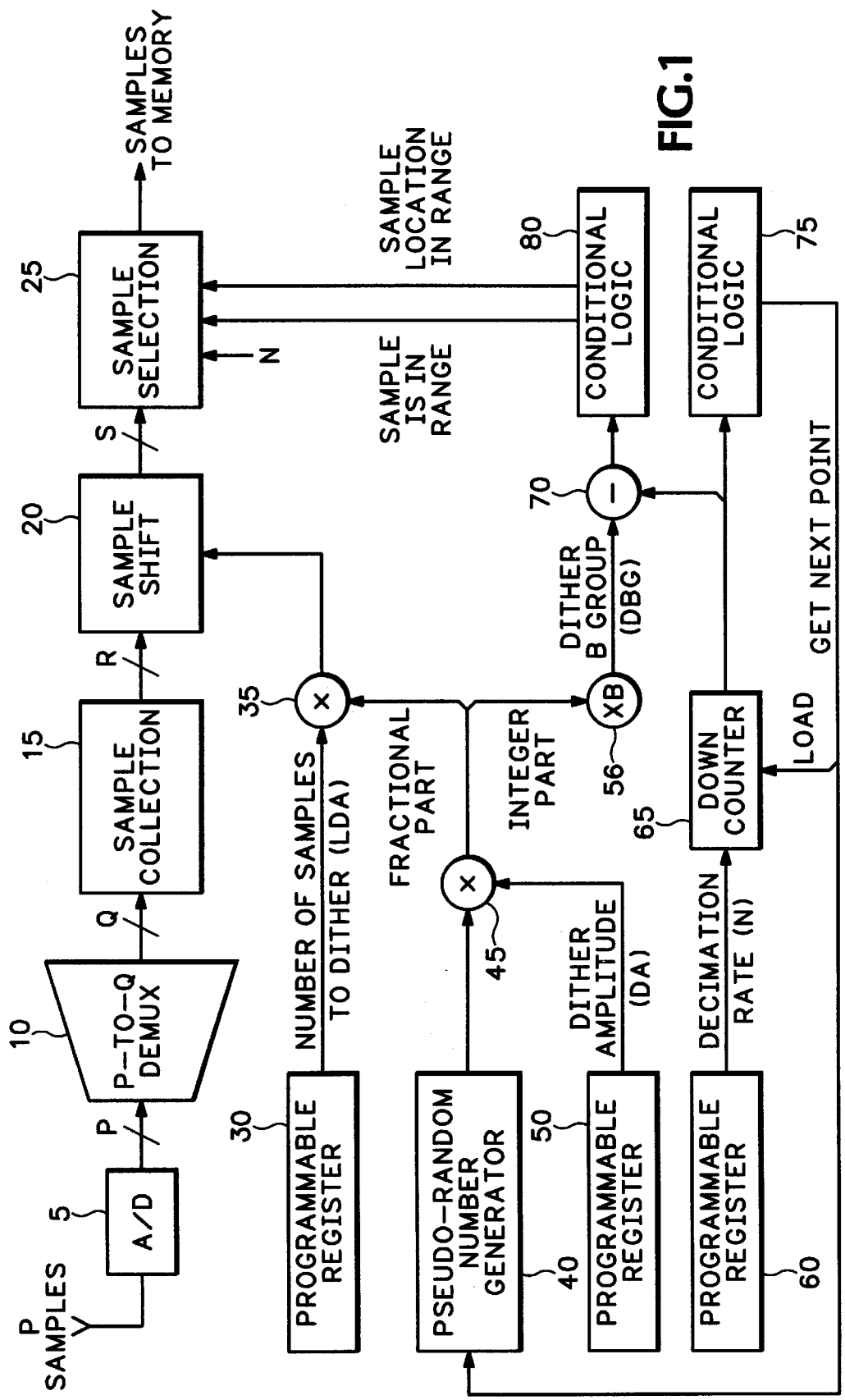
FIG. 1 (the sole FIGURE) shows, in block diagram form, apparatus suitable for use with the subject invention.

FIG. 1 is a simplified block diagram showing a portion of the front end (acquisition section) of an oscilloscope. Referring to FIG. 1, samples are applied to a P-to-Q demultiplexer 10. Demultiplexer 10 applies the multibit signal generated at its output to an input of a Sample Collection unit 15. Sample Collection unit 15 has an output terminal coupled to a first input terminal of a Sample Shift Register 20. Sample Shift Register 20 is coupled to a first input terminal of a Sample Selection unit 25. Sample Selection unit 25 has an output coupled to a memory (not shown for simplicity).

A Programmable Register 30 is coupled to one input terminal of a Multiplier 35. Multiplier 35 has an output terminal coupled to the shift input terminal of Sample Shift Register 20. A Pseudo-Random Number Generator 40 and a Programmable Register 50 provide the signals at respective input terminals of a Multiplier 45. The fractional part of the numeric signal generated by Multiplier 45 is applied to the other input terminal of Multiplier 35, and the integer portion is applied to a Subtractor 70 via a further Multiplier unit 55. A third Programmable Register 60 has an output terminal coupled to an input of a Down Counter 65. Down Counter 65 has an output terminal connected to the second input of Subtractor 70 and to the input terminal of a Conditional Logic Circuit 75. The output from Conditional Logic Circuit 75 is applied to Pseudo-Random Number Generator 40. The output terminals of Subtractor 70 are coupled to the input terminal of Conditional Logic Circuit 80. Conditional Logic Circuit 80 has two outputs, both of which are connected to Sample Selection Unit 25.

The subject invention solves the aliasing problem by use of a different method from that of the prior art by dithering data that has been demultiplexed into a wider and slower stream of samples. Normally, the data would be subsampled at equal intervals. For instance, one would store every Nth sample and ignore the other samples. With dither, the average subsampling interval is still N, however the data is taken with some variation around the Nth sample. For instance, it is herein recognized that one should randomly pick one sample out of a group N, then move to the next group of N samples and repeat the process. By dithering the data in this manner the aliased frequencies will show up as noise rather than appearing to be a lower frequency signal.

In operation, data flows into the circuit from an A/D converter (5). P samples of data come in from the A/D each clock cycle. P can be 1 or higher. If P equals 1, then the sampling frequency equals the A/D clock frequency. If P is greater than 1 the sampling frequency is equal to P times the A/D clock frequency. The data from the A/D is further demultiplexed to slow it down. The data flows into the Demultiplexer 10 at P samples per A/D clock cycle and flows out at Q samples per system clock cycle. Q is greater than P and the system clock frequency is lower than the A/D clock frequency. This slower stream can be processed by standard CMOS logic. The tradeoff is that the data stream is now wider and more difficult to process.

After the Demultiplexer 10, the data stream can be made even wider to get the desired number of samples (R). This is done by storing data over one or more system clock cycles in a shift register. The output of this sample collection circuit is R-samples-wide where consecutive samples represent consecutive sample points in time. Next, the R-sample-wide stream is applied to Shifter 20. Shifting the samples causes circuitry after the shifter to operate on different samples. The amount of shift applied to the data is controlled by a random dither value. This dither value could represent the entire dither, when the amount of dither is low, or just a portion of the dither for higher amounts of dither. For example, if it were desired to dither the data by 560 samples, the circuit needs to randomly pick one of every 560 samples. To do this with a base (B) of 10, the shifter would apply a random shift of 0 to 9. The sample selection circuit, further downstream, would randomly select a group of 10 samples out of 56 groups of 10. The 0 to 9 shift of the shifter along with the selection of one of the 56 groups of 10 gives the random selection of 1 out of 560 samples. For lower amounts of dither, for example, 16 samples, the dither can be accomplished by use of Shifter 20 alone.

Sample Selection Circuit 25 can output one or more samples at a time. When the subsample rate is higher than the system clock rate multiple output samples will be available on some or all system clock cycles. When the subsample rate is lower than the system clock rate output samples will be available only on some system clock cycles. For low amounts of dither, where the dither is handled by controlling Shifter 20, the sample selection circuitry selects every Nth sample. The shifting of the data in Shifter 20 causes the dither.

When N has a higher value, larger amounts of dither are required to effectively dither the signal. An amount of dither equal to N samples is effective for reducing aliasing without adding excessive jitter to the data. For higher amounts of dither, Sample Selection Circuit 25 becomes an active part of the dither. Sample Selection Circuit 25 is controlled by input signals that tell the selection circuitry that the dither point is now in the range of samples available on its inputs and which group of B samples it is in. Sample Selection Circuit 25 will take the last sample in the group of B samples. The shifter has already done the fine alignment of the data so that this is the proper sample.

This completes the description of the data path. Three major control signals are used to control the data path. These signals are the shift value, and the controls telling the sample selection circuit which point to select and when to select it.

As alluded to above, the dither circuit of the subject invention operates in two ways. First, all of the dither can be done with the shifter and sample selector. For further discussion, the mode where the entire dither is done in the shifter will be called low dither mode. The second mode where the dither is done with both the sample shifter and sample selector will be called high dither mode. The operation of the dither control circuitry starts with the generation of a random or pseudo-random number generated in a Pseudo-Random number Generator 40. This number can be thought of as a fraction. For low dither mode this fraction is multiplied by one; resulting in the same fraction. The resulting fraction, or part of it, is multiplied in a Multiplier 35 by the desired number of samples of dither (LDA) stored in a programmable register 30. The integer part of this result is used to control the sample shifter 20.

For high dither mode, the pseudo-random number is multiplied in a Multiplier 45 by a dither amplitude (DA) value stored in a further programmable register 50. DA is the desired number of sample points of the dither. DA should be less than or equal to N and both should be integer multiples of the base (B). The result of the multiplication of the PRN and DA is split into integer and fractional parts. The fractional part is multiplied by the base (B) (which is programmed into a programmable register 30) in a Multiplier 35. This results in a number between 0 and B−1 that is applied to the shifter. The integer part of the result of the multiplication of PRN and DA is also multiplied by B in Multiplier 55. This results in Dither B Group (DBG), a number between 0 and DA−B, which is also a multiple of B and less than N. DBG points to a group of B samples within the interval of N samples and the shift value, output by Multiplier 35, picks out one of the B samples in this group.

The shift value can be sent directly to Sample Shifter 20. DBG is compared to a down counter value. Down Counter 65 is part of the normal subsampling circuit. It is loaded with the desired number of input samples per subsample which is N. As data passes through the circuit Down Counter 20 counts down by multiples of B. The down count can be 0, B, 2*B, 3*B, . . . The multiple of B used for each down count is dependent on the state of the circuit, choice of B, and data widths. When the down count value is lower than the amount of data available to process, and the circuit has the capability to process it, a Get Next Point signal is generated. This signal causes the Down Counter 65 to be reloaded with N on the next clock cycle. It also causes the dither circuit to advance to the next dither value.

Each system clock cycle DBG is subtracted from the current down counter value. The result of this subtraction gives the number of samples from the current point to the point to be taken. If the value is in the range of data available at the input of the sample selector the conditional logic will generate a "Sample is in Range" signal for Sample Selection Circuit 25. It also generates a signal telling Selection Circuit 25 which group of B samples the desired sample is in. These signals cause Sample Selection Circuit 25 to produce a sample at the output. As stated earlier, the shifter will have already shifted the samples to narrow it down to which sample in the group of B is taken.

It is important to note that Sample Shifter 20 and Sample Selection Circuit 25 can be operated independently to satisfactorily accomplish a dither function. However, operation of Sample Shifter 20 and Sample Selection Circuit 25 in cooperation is felt to provide a more optimum solution.

What has been described is a useful dithering arrangement to prevent aliasing when subsampling with a digital oscilloscope, or the like. This arrangement is defined by the following claims.

What is claimed is:

1. A dithering arrangement for a digital oscilloscope, comprising:

an A/D converter for providing samples of a waveform to be analyzed;

a demultiplexer having an input coupled to an output of said A/D converter for receiving and demultiplexing said samples;

a sample shifter having a first input coupled to an output of said demultiplexer for producing one of a plurality of a samples of said waveform within a given range of samples;

programmable control signal generation circuitry responsive to predetermined dither characteristics and to a pseudo-randomly generated number for producing a range control signal relating to said range of samples; and sample selection circuitry coupled to said sample shifter and to said programmable control signal generation circuitry, and responsive to said one sample of said plurality of samples and to said range control signal for selecting a particular sample from a group of N samples for producing a dithering about an Nth sample.

2. The dithering arrangement of claim 1, wherein:

said programmable control signal generation circuitry includes a pseudo-random number generator for producing said pseudo-randomly generated number.

3. The dithering arrangement of claim 2, wherein:

said programmable control signal generation circuitry includes dither amplitude register for storing a predetermined dither amplitude value; and said pseudo-randomly generated number and said predetermined dither amplitude value being combined to form a randomized dither amplitude value.

4. The dithering arrangement of claim 3, wherein:

said programmable control signal generation circuitry includes a register for storing a value indicative of number of samples to dither; and said value indicative of number of samples to dither and a fractional part of said randomized dither amplitude value being combined to form a sample shift control signal for controlling said sample shifter.

5. The dithering arrangement of claim 4, wherein:

said programmable control signal generation circuitry includes a multiplier for receiving an integer part of said randomized dither amplitude value and multiplying said integer part of said randomized dither amplitude value by a constant to form a dither group signal, indicative of a subgroup of samples within said group of N signals.

6. The dithering arrangement of claim 5, wherein:

said programmable control signal generation circuitry includes a third programmable register for storing a decimation rate value;

said programmable control signal generation circuitry further including a down counter for receiving a signal indicative of said decimation rate value and producing an output signal representing values decremented from said decimation rate value.

7. The dithering arrangement of claim 6, wherein:

said programmable control signal generation circuitry includes a subtractor for receiving said dither group signal and said down counter output signal, and forming a difference signal therefrom.

8. The dithering arrangement of claim 7, wherein:

said programmable control signal generation circuitry includes a condition logic circuitry for receiving said difference signal and forming said range control signal therefrom.

9. A dithering arrangement, comprising:

source of digital signal samples;

a demultiplexer having an input coupled to an output of said digital signal sample source for receiving and demultiplexing said samples;

a sample shifter having a first input coupled to an output of said demultiplexer for producing one of a plurality of said samples within a given range of samples;

programmable control signal generation circuitry responsive to predetermined dither characteristics and to a pseudo-randomly generated number for producing a range control signal relating to said range of samples; and sample selection circuitry coupled to said sample shifter and to said programmable control signal generation circuitry, and responsive to said one sample of said plurality of samples and to said range control signal for selecting a particular sample from a group of N samples for producing a dithering about an Nth sample.

10. The dithering arrangement of claim 9, wherein:

said programmable control signal generation circuitry includes a pseudo-random number generator for producing said pseudo-randomly generated number.

11. The dithering arrangement of claim 10, wherein:

said programmable control signal generation circuitry includes a register for storing a value indicative of number of samples to dither; and said value indicative of number of samples to dither and a fractional part of said pseudo-randomly generated number being combined to form a sample shift control signal for controlling said sample shifter.

12. The dithering arrangement of claim 11, wherein:

said programmable control signal generation circuitry includes a multiplier for receiving an integer part of said pseudo-randomly generated number and multiplying said integer part of said pseudo-randomly generated number by a constant to form a dither group signal, indicative of a subgroup of samples within said group of N signals.

13. The dithering arrangement of claim 12, wherein:

said programmable control signal generation circuitry includes a third programmable register for storing a decimation rate value;

said programmable control signal generation circuitry further including a down counter for receiving a signal indicative of said decimation rate value and producing an output signal representing values decremented from said decimation rate value.

14. The dithering arrangement of claim 13, wherein:

said programmable control signal generation circuitry includes a subtractor for receiving said dither group signal and said down counter output signal, and forming a difference signal therefrom.

15. The dithering arrangement of claim 14, wherein:

said programmable control signal generation circuitry includes a condition logic circuitry for receiving said difference signal and forming said range control signal therefrom.

16. A dithering arrangement, comprising:

source of digital signal samples;

a demultiplexer having an input coupled to an output of said digital signal sample source for receiving and demultiplexing said samples;

programmable control signal generation circuitry responsive to predetermined dither characteristics and to a pseudo-randomly generated number for producing a range control signal relating to a range of samples; and one of a sample shifter having a first input coupled to an output of said demultiplexer for producing one of a plurality of said samples within said range of samples;

and a sample selection circuit coupled to an output of said demultiplexer and to said programmable control signal generation circuitry, and responsive to said range control signal for selecting a particular sample from a group of N samples for producing a dithering about an Nth sample.

\* \* \* \* \*